(12) United States Patent  (10) Patent No.: US 7,512,387 B2
Glueck  (45) Date of Patent: Mar. 31, 2009

(54) METHOD AND CONTROL SYSTEM FOR CONTROLLING THE OUTPUT POWER OF AN RF AMPLIFIER SYSTEM

(75) Inventor: Michael Glueck, Freiburg (DE)

(73) Assignee: Huettinger Elektronik GmbH + Co. KG, Freiburg (DE)

( * ) Notice: Subject to any disclaimer, the term of this patent is extended or adjusted under 35 U.S.C. 154(b) by 445 days.

(21) Appl. No.: 11/130,413

(22) Filed: May 17, 2005

(65) Prior Publication Data

US 2005/0255809 A1 Nov. 17, 2005

(30) Foreign Application Priority Data

May 17, 2004 (DE) .................. 10 2004 024 805

(51) Int. Cl.
 *H01Q 11/12* (2006.01)
 *H04B 1/04* (2006.01)
(52) U.S. Cl. ................. 455/127.1; 455/127.2; 455/126; 455/522; 455/115.1; 455/115.3; 455/115.4; 455/91; 330/124 R; 330/127; 330/134; 330/137; 330/138; 330/96; 330/103; 330/105; 330/53; 330/84; 332/103; 375/297; 375/298
(58) Field of Classification Search ......... 455/103–105, 455/115.1–4, 126, 127.1–3, 522, 91, 313; 330/107, 295, 124 R, 124 D, 149, 127–142, 330/96, 103, 10, 53–54, 845; 332/103–105; 375/261–265, 279–284, 296–298, 308; 324/536, 324/544
See application file for complete search history.

(56) References Cited

U.S. PATENT DOCUMENTS 4,701,716 A * 10/1987 Poole ........................ 330/43

5,222,246 A 6/1993 Wolkstein
5,903,192 A 5/1999 Ludwig et al.
6,046,649 A * 4/2000 Lange ....................... 332/103
6,211,734 B1 * 4/2001 Ahn .......................... 330/149
6,753,685 B2 * 6/2004 Carlsson et al. ............ 324/536
6,799,020 B1 * 9/2004 Heidmann et al. .......... 455/103
2004/0113688 A1 6/2004 Glueck
2007/0146074 A1 * 6/2007 Osman ...................... 330/278

FOREIGN PATENT DOCUMENTS

JP 08-81552 7/1996

* cited by examiner

*Primary Examiner*—Tuan A Tran
(74) *Attorney, Agent, or Firm*—Fish & Richardson P.C.

(57) ABSTRACT

A system for controlling a power supplied to a load from a radio frequency amplifier system includes a radio frequency signal generator adapted for generating a radio frequency signal, an amplifier to which the radio frequency signal is supplied and that amplifies the radio frequency signal into a radio frequency power signal, a power coupler connected to the amplifying member for coupling the radio frequency power signals, where the power coupler includes a summing connection adapted for connection to the load and a compensating connection adapted for connection to a dissipative element. A first control value generating member is adapted for receiving a signal proportional to a power output from the power coupler at the summing connection and is adapted for generating a first control signal for controlling the amplifier or a current supply that supplies current to the amplifier. A second control value generating member is adapted for receiving a signal proportional to a power output from the power coupler at the compensating connection and is adapted for generating a second control signal for controlling the amplifier or the current supply.

23 Claims, 1 Drawing Sheet

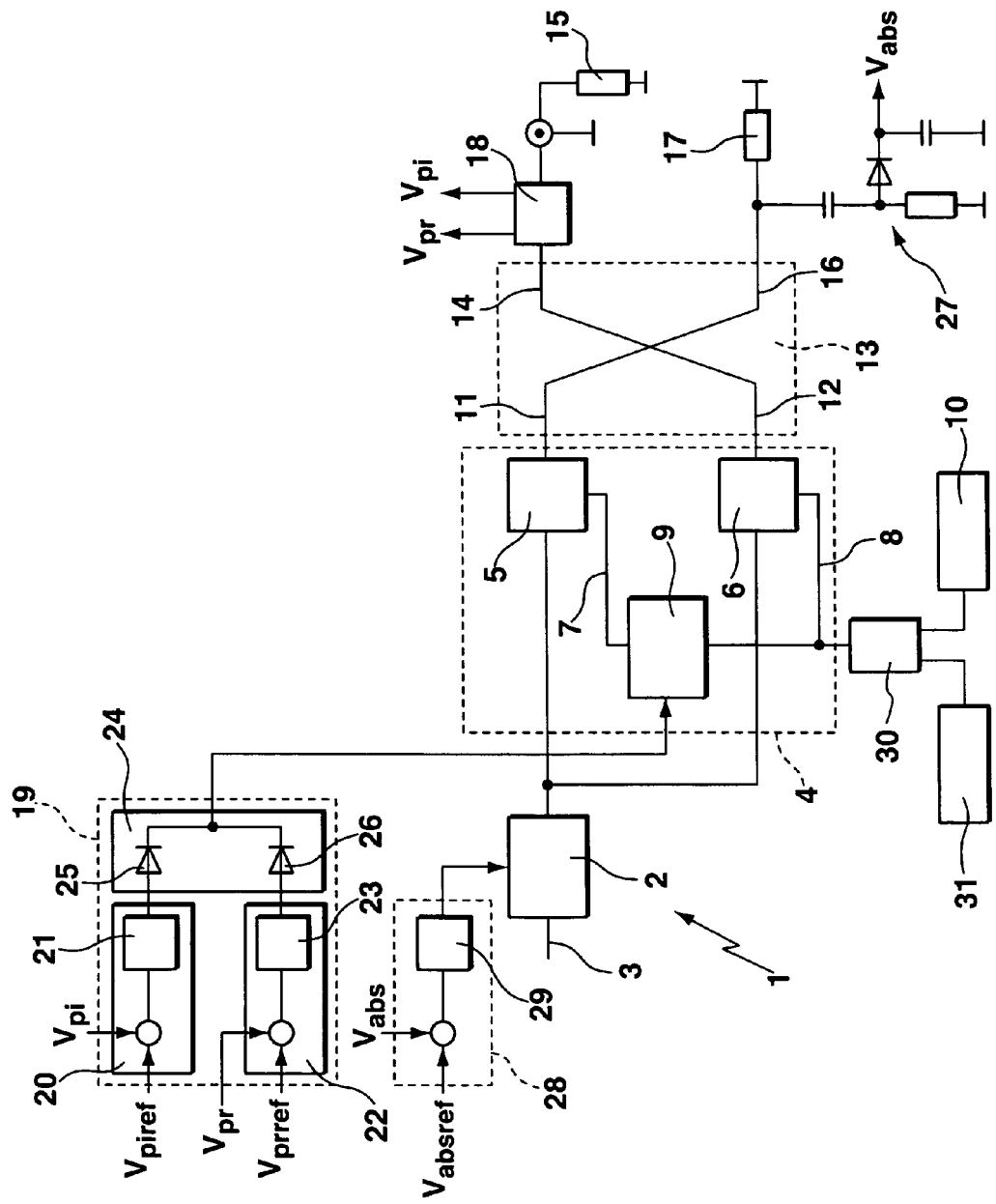

METHOD AND CONTROL SYSTEM FOR CONTROLLING THE OUTPUT POWER OF AN RF AMPLIFIER SYSTEM

CLAIM OF PRIORITY

This application claims priority to German Patent Application Serial No. 10 2004 024 805, filed on May 17, 2004, the entire contents of which are hereby incorporated by reference.

TECHNICAL FIELD

This disclosure relates to a method of controlling the output power of a radio frequency (RF) amplifier system and to a control system of a radio frequency amplifier system.

BACKGROUND

Power amplifiers for exciting plasma processes or laser discharge paths in a frequency range between 1 and 50 MHz, in particular at industrial frequencies of 13.56, 27.12, and 40.68 MHz are generally known. There are different power classes for power amplifiers of this type having output powers ranging from approximately 1 kW to several 100 kW. For a low power in the range between 1 and 20 kW, amplifiers on the basis of semiconductor modules (solid state amplifiers) are preferably used. Tube amplifiers are frequently used for a larger power. The tube amplifiers have an amplifier tube that is driven by a semiconductor power amplifier module, i.e., an amplifier that corresponds to amplifiers used for a smaller power. Since tubes require more space, it is desired to construct power amplifiers for larger output powers also of amplifiers based on semiconductor modules. Towards this end, solid state amplifiers of a smaller power are connected to suitable power couplers.

An important aspect of power amplifiers based on semiconductor modules is the minimization of the power loss, mainly in the semiconductor modules themselves. So-called amplifying circuits in resonance operation are advantageous, wherein the semiconductor modules are switched to have a particularly small loss.

Typical systems of switched amplifiers of classes D, E, and F are known, but a common problem of these switched amplifiers is the dynamically varying load. Such a load can develop in plasma processes and also in laser excitation or amplifier tubes, and the power supplied to the load can be reflected by the load. This reflected power is partially converted into heat by the amplifiers and is partly reflected back from the amplifier toward the load. Multiple reflections from load to amplifier and back produce instabilities in the amplifier and voltage and current increases, which can destroy the components in the amplifier and, in particular, also the semiconductor modules.

The output power of these amplifiers is usually controlled through control of the supplied direct voltage or direct current. If the power is to be rapidly controlled at the output, the supplied direct current must be rapidly controlled. This represents, however, also additional complexity for the direct voltage supply requiring expensive components and complex control.

Thus, a method and a control system for providing rapid and exact control with little power loss is desirable.

SUMMARY

In a first general aspect, a method of controlling the output power supplied to a load from a radio frequency amplifier system includes allocating a total output power from the amplifier system between a first portion supplied to the load and a second portion supplied to a dissipative element, determining a value representing a forward power supplied from the amplifier system to the load or determining a value representing a reflected power reflected from the load, determining a first control value based a predetermined forward power value and the value representing the forward power or based on a predetermined reflected power value and the value representing the reflected power. A value representing a power supplied to the dissipative element is determined, and a second control value is determined based on a predetermined dissipated power value and the value representing the power supplied to the dissipative element. An amplifying member of the amplifier system that supplies power to the load is controlled based on one of the control values, and a current supply that supplies an output current to the amplifying member is controlled based on one of the control values.

Implementations can include one or more of the following features. For example, all the total output power can be allocated to the first portion and none of the total output power can be allocated to the second portion. The method can further include determining a value representing the forward power supplied from the amplifier system to the load, determining a value representing a reflected power reflected from the load, and determining a first control value based the predetermined reflected power value, the predetermined forward power value, the value representing the forward power, and the reflected power. The output power of the RF amplifier system supplied to the load can be controlled at a rate that is faster than a rate at which the output current of the current supply is controlled. The first control value can control the amplifying member, and the second control value can control the current supply.

The method can further include generating the total output power by amplifying RF signals to RF power signals in at least two amplifier paths, adjusting a phase difference between the RF power signals in the at least two amplifier paths, and supplying the RF power signals to a power coupler. The phase difference between the RF power signals can be adjusted based on the control value that controls the amplifying member.

The method can further include determining a value representing the forward power supplied from the amplifier system to the load, determining a value representing a reflected power reflected from the load, and, if the value representing the reflected power is smaller or equal to the predetermined forward power value, determining the first control value based the predetermined forward power value and the value representing the forward power, and otherwise, determining the first control value based the predetermined reflected power value and the value representing the reflected power, and controlling the amplifier member of the amplifier system that supplies power to the load based on the first control value.

In another general aspect, a system for controlling a power supplied to a load from a radio frequency amplifier system includes a radio frequency signal generator adapted for generating a radio frequency signal, an amplifier to which the radio frequency signal is supplied and that amplifies the radio frequency signal into a radio frequency power signal, a power coupler connected to the amplifying member for coupling the radio frequency power signals, where the power coupler includes a summing connection adapted for connection to the load and a compensating connection adapted for connection to a dissipative element. A first control value generating member is adapted for receiving a signal proportional to a power output from the power coupler at the summing connection and is adapted for generating a first control signal for controlling the amplifier or a current supply that supplies current to the amplifier. A second control value generating member is adapted for receiving a signal proportional to a power output from the power coupler at the compensating connection and is adapted for generating a second control signal for controlling the amplifier or the current supply.

Implementations can include one or more of the following features. For example, The amplifier can amplify radio frequency signal in at least two amplifier paths, where each amplifier path includes at least one radio frequency power amplifier and where at least one amplifier path includes a controllable phase shifter adapted for shifting a relative phase between radio frequency power signals in the at least two paths. The power coupler can be a 90° power coupler or a 3 dB coupler.

The system can further include a directional coupler connected to the summing connection and adapted for providing the signal proportional to a power output at the summing connection to the first control value generating member. The system can further include a voltage detector connected to the compensating connection and adapted for providing a signal proportional to a power output from the power coupler at the compensating connection to the second control value generating member. The radio frequency power amplifiers can be switching amplifiers. The amplifier can include at least three amplifier paths, where each amplifier path includes at least one radio frequency power amplifier and where at least two amplifier paths include a controllable phase-shifter adapted for shifting a relative phase between radio frequency power signals in different paths.

In another general aspect, a system for controlling a power supplied to a load from a radio frequency amplifier system includes a radio frequency signal generator adapted for generating a radio frequency signal, an amplifier to which the radio frequency signal is supplied and that amplifies the radio frequency signal into radio frequency power signals in at least two amplifier paths, where each amplifier path includes at least one radio frequency power amplifier and where at least one amplifier path includes a controllable phase-shifter adapted for shifting a relative phase between radio frequency power signals at outputs of the at least two paths, a phase-sensitive power coupler connected to the at least two paths of the amplifier, where the power coupler includes a summing output, a first measuring member connected to the summing output, where the first measuring member is adapted for providing signals characterizing a forward power supplied to the load and a reflected power reflected from the load, and a first control value generating member adapted for receiving the signals from the first measuring member and adapted for controlling the phase-shifter based on a comparison of the signals to predetermined values for the forward power and the reflected power.

Implementations can include one or more of the following features. For example, the system can further include a current supply adapted for providing current to the radio frequency power amplifiers, a voltage detector connected to the compensating output and adapted to provide a signal characterizing a power output from the power coupler and dissipated in a dissipative element, and a second control value generating member adapted for receiving the signal provided by the voltage detector and for controlling the current supply based on a comparison of the signal provided by the voltage detector with a predetermined value for the power dissipated in a dissipative element. The radio power amplifiers can be designed as switching amplifiers. The first control value generating member can include at least two control members for generating control signals and a priority circuit connected to the control members and adapted for generating the first control value based on the control values generated by the control members. The amplifier can include at least three amplifier paths, where each amplifier path includes at least one radio frequency power amplifier and wherein at least two amplifier paths include a phase-shifter adapted for shifting a relative phase between radio frequency power signals in two different paths.

The details of one or more implementations are set forth in the accompanying drawings and the description below. Other features will be apparent from the description and drawings, and from the claims.

DESCRIPTION OF DRAWINGS

FIG. 1 is a control system of an RF amplifier system.

DETAILED DESCRIPTION

As shown in FIG. 1, an amplifying member 4 is supplied with current by a switched current supply 2 whose input 3 is connected to a power supply. In particular, RF power amplifiers 5 and 6, which are based on semi-conductor components and are part of the amplifying member 4 and are disposed in the amplifier paths 7 and 8, are supplied with current. A controllable phase-shifter 9 is disposed in the amplifier path 7. An RF signal provided by an oscillator 10 is supplied in the amplifier path 8 directly to the power amplifier 6, and is supplied in the amplifier path 7, after being phase-shifted by the phase-shifting member 7, to the amplifier 5. The RF power signals applied to the outputs of the RF power amplifiers 5 and 6, which have a phase difference relative to each other, are supplied to the input gates 11 and 12 of a power coupler 13 that is formed as 90° power coupler.

The output power of the power coupler 13 is applied to the summing output 14 to which a load 15 can be connected. The lost power, if any, in particular, the power that is not applied to the summing output 14 due to the phase shift, is applied to the compensating output 16. An absorbing resistor 17 is connected to the compensating connection 16 in which the power loss is converted into heat. A first measuring member 18, which can be formed as a directional coupler, is disposed at the summing output 14 and detects the forward power incident on the load, $V_{pi}$, and the power reflected from the load, $V_{pr}$, and transfers signals representing $V_{pi}$ and $V_{pr}$ to a first control value generating member 19.

The detected value, $V_{pi}$, which describes the forward power, is compared in a first control member 20 with a first predetermined value, $V_{piref}$, by forming the difference between $V_{pi}$ and $V_{piref}$. This difference signal is supplied to a controller 21 that is designed as a PI controller to determine a control value for the controllable phase-shifting member 9. The control member 20 may thereby perform linearization.

The detected value, $V_{pr}$, which describes the reflected power, is compared with a second predetermined value, $V_{prref}$, in a second control member 22 by forming the difference between $V_{pr}$ and $V_{prref}$. This difference signal is supplied to a controller 23 that is designed as a PI controller to determine a control value to control the controllable phase-shifting member 9. The control member 22 can thereby perform linearization.

A priority circuit 24 that includes two diodes 25 and 26 is disposed downstream of the controllers 21 and 23. The priority circuit 24 determines the control value(s) used for control of the system, and supplies the control value(s) to the phase-shifting member 9 as a first control value.

The compensating output 16 has a second measuring member 27, which can be designed as a voltage detector that determines a voltage value, $V_{abs}$, that corresponds to the power dissipated in the absorbing resistor 17. A signal representing this value, $V_{abs}$, is fed to a second control value detecting member 28, where it is compared with a predetermined value for the power loss, $V_{absref}$, by forming the difference between $V_{abs}$ and $V_{absref}$. From this difference, a second control value is determined in a controller 29, which can be designed as a PI controller, for controlling the switched current supply 2. The second control value detecting member 28 may thereby perform linearization.

The RF signal generated by the oscillator 10 can be pulsed by linking the RF signal with a pulse signal supplied by a pulse modulator 31 via a logic member 30 designed as an AND gate.

Thus, the output power from the RF amplifier system 1 can be controlled through control of the current supply 2 and also through control of the amplifying member 4. The control may be influenced at two locations with different characteristics. If the power at the summing connection 14 is supplied to a load 15, and the power loss at the compensating connection 13 is supplied to an absorbing resistor 17, which dissipates the power loss, this control system may be used to control the RF amplifier system with the first control value generating member 19, such that the power supplied to the load 15 corresponds to a predetermined value. To control the power loss dissipated in the resistor 17, the second control value generating member 28 is used to maintain the power loss under a defined limit value.

The first control value influences the RF amplifier system by controlling the phase shifter 9, which controls what proportion of output power from the amplifying member 4 is supplied to the load 15 and what proportion of the output power form amplifying member 4 is supplied to the absorbing resistor 17. If the first control value influences the RF amplifier system such that the reduction of the power supplied to the load 15 power always implies an increase in the power that is dissipated in the resistor 17, the second control value may influence the RF amplifier system such that the power lost in the resistor 17 remains within pre-defined limits, in particular, below a predetermined maximum value. Thus, the second predetermined value can define a value for the maximum power loss that must not be exceeded.

The forward power incident on the load 15 and also the reflected power from the load can be used to control the power output to the load 15. The first predetermined value, $V_{piref}$, can characterize a desired forward power, and the second desired value, $V_{prref}$, can characterize a desired reflected power. The values describing the various powers may be, inter alia, the measured powers themselves, voltages, currents, and functions thereof.

With the system described herein, the output power of the RF amplifier system can be controlled at a higher rate than the output current of the current supply 2 can be controlled. For example, the output power supplied to the load 15 can be adjusted much faster to lower values through driving of the amplifying member 4 than by controlling the current supply 2. The output of the current supply 2 can achieve a desired value change with a delay in the range of approximately 1 ms to 100 ms, whereas the output of the amplifying member 4 supplied to the load 15 can be controlled on a timescale of about 1 to 100 µs. Thus, the output amplifying member 4 supplied to the load 15 generally can be controlled on a timescale that is 10 times faster (or more than 100 times faster) than the output from the current supply 2 supplied to the amplifying member can be controlled. Thus, very fast control of the output power supplied to the load 15 through control of the amplifying member 4 is achieved. During rapid control, the power loss that is dissipated in the absorbing resistor 17 may increase correspondingly when the output power to the load 15 is reduced, because control of the current supply 2 is what limits the power loss that is dissipated in the resistor 17. However, a temporary increase in the power loss dissipated in the resistor 17 (lasting about 1-100 ms) can be accepted when the dynamics of the overall control of the output power is considerably faster (e.g., occurring on a timescale of about 1-100 µs).

Thus, in one implementation, the first control value can drive the amplifying member 4, and the second control value can control the current supply 2. In this case, the values describing the forward power, $V_{pi}$, and the reflected power, $V_{pr}$, and the corresponding predetermined values, $V_{piref}$ and $V_{prref}$, can be used to generate a first control value for controlling the amplifying member 4 thereby providing rapid control and permitting rapid reaction to load changes in applications with rapid load changes. Reaction to such load fluctuations is preferably much faster than when controlling the output power supplied to the load only by controlling the current supply 2.

In a particularly simple manner, the output power from the amplifying member 4 can be generated by amplifying an RF signal from the oscillator 30 in at least two amplifier paths 7 and 8 to generate an RF power signal in each path, where the phase difference of the RF power signals is adjusted relative to each other, and two RF power signals respectively are supplied to the power coupler 13. The control value that controls the amplifying member 4 may thereby adjust the phase difference of the RF power signals in the paths 7 and 8 relative to each other, which provides particularly fast adjustment of the output power supplied to the load 15. In the power coupler 13, the output power supplied to the load 15 is generated from the RF power signals in dependence on the phase difference. The following relations apply:

$$U_{OUT} = \frac{(U_{RF1} + U_{RF2})}{2}\sqrt{(1+\cos(\Delta\varphi))} \text{ and } P_{OUT} = \frac{U_{OUT}^2}{R_{LOAD}},$$

where $P_{OUT}$ is the output power at a summing output 14 of the power coupler 13. $R_{load}$ is the resistance of the load 15 connected to the summing output, $U_{RF1}$ and $U_{RF2}$ are the RF voltage signals corresponding to the RF power signals that are applied to the outputs of the amplifier paths, as input signals 11 and 12 to the power coupler 13, and $\Delta\phi$ is the phase difference between the RF power signals on paths 7 and 8.

The output power supplied to the load 15 therefore is related nonlinearly to the phase difference. For compensation, a linearization member can be provided in the control path to control the output power. Also, digitization of the measured values and control of the phase difference using a digital signal processor (DSP) or a micro controller (µC) can permit digital linearization of the output from the power coupler 13.

The adjustment of the phase difference of the RF power signals in paths 7 and 8 relative to each other is particularly simple if the phase of the RF signal, which is fed into both amplifier paths 7 and 8, is changed by the phase shifter 9 in one path 8 compared to the RF signal of the other amplifier path 8. With switched amplifiers, such an RF signal has a small level and small power, usually it is at logic level, i.e., less than about 5 V. The phase of such a signal can be easily adjusted also at frequencies between 1 MHz and 50 MHz.

The output power is advantageously controlled on the basis of the first predetermined value, $V_{piref}$, and the measured value, $V_{pi}$, that describes the forward power, if the measured value that describes the reflected power, $V_{pr}$, is smaller than or equal to the second predetermined value, $V_{prref}$. The output power is controlled on the basis of the second predetermined value, $V_{prref}$, and the measured value, $V_{pr}$, that describes the reflected power, if $V_{pr}$ is larger than the $V_{prref}$. This permits control of the output power supplied to the load 15 on the basis of the measured forward power, $V_{pi}$, and $V_{pi}$ can be controlled to equal $V_{piref}$ as long as the $V_{pr}$ is less than $V_{prref}$. If the reflected power, $V_{pr}$, exceeds $V_{prref}$, the output power supplied to the load can be controlled such that $V_{pr}$ is reduced and, in particular, drops again below $V_{prref}$. It is thereby ensured that the amplifiers 5 and 6, into which the reflected power is coupled back, are not destroyed.

A pulsed RF output power can be generated from the systems. For example, a pulsed RF output power with pulse frequencies between 100 Hz and several 100 kHz can be used for laser excitation (e.g., in a gas laser) and also for plasma processes. Also, the RF signal can be pulsed. An RF power signal is an RF signal that is amplified by an amplifier. The RF signal may be pulsed in a particularly simple and inexpensive manner if the RF signal and a pulse signal are connected via a logic circuit. Also, the current supply 2 can be switched, as switched current supplies show particularly high efficiency and provide simple and exact control.

The power coupler 13 can be designed as a 90° power coupler, in particular, as a 3 dB coupler. A 0° power coupler or 180° power coupler with 90° phase shifter upstream of an input gate can also be considered a 90° power coupler. The RF power amplifiers 5 and 6 in the amplifier paths 7 and 8 react less sensitively to mismatching at the summing connection 14 of the power coupler 13, since the 90° power coupler transforms any mismatching to less critical values. Independently of the internal resistances of the RF power amplifiers 5 and 6 in the amplifier paths 7 and 8, the output resistance at the summing connection 14 of a 90° power coupler generally is equal to the characteristic impedance of the power coupler 13 if the resistance of the absorbing resistor 17 is equal to the characteristic impedance.

A 90° phase shifter for microwave applications (e.g., with frequencies of about 300 MHz to about 300 GHz) can be easily realized by a λ/4 line. For lower frequencies and mainly for high power, this phase shifting can be complex. A 3 dB power coupler includes this 90° phase shift and can be realized in a inexpensive manner for frequency ranges of about 2 to 50 MHz, in particular, for industrial frequencies of 13.56 MHz, 27.12 MHz, and 40.68 MHz and also for high powers of up to more than 100 kW.

The directional coupler 18 coupled to the summing connection 14 and to the first control value generating member 19 permits measurement of the forward power, $V_{pi}$, and the reflected power, $V_{pi}$. A first control value can be determined therefrom, which controls, e.g., the phase-shifting member 9 permitting control of the RF amplifier system 1.

The second measuring member 27, in particular, a voltage detector, may be connected to the compensating connection 16 and connected to the second control value generating member 28 and can be used to measure power loss in the absorbing resistor 17. A second control value can be determined therefrom and used to control the current supply 2.

Thus, a control system of a radio frequency amplifier system can include an amplifying member 4 that includes at least two amplifier paths 7 and 8 with at least one RF power amplifier 5 and 6 in each path, respectively. At least one amplifier path includes a controllable phase-shifting member 9, and the RF power signals that are applied to the outputs of the amplifier paths 7 and 8 are phase-shifted relative to each other. A phase-sensitive power coupler 9 is connected to the two amplifier paths 7 and 8 and includes a summing output 14 with the first measuring member (e.g., a directional coupler) 18 connected thereto, and a compensating output 16. The first measuring member 18 issues a signal that describes the forward power, $V_{pi}$, and a signal that describes the reflected power, $V_{pr}$. A control value generating member 19 is provided that controls the controllable phase-shifting member 9 and includes the signals of the first measuring member 19 and control values that describe the forward and reflected power as input signals. If an RF signal of relatively small power is fed into the at least two amplifier paths 7 and 8, e.g., in the logic level range, the controllable phase-shifting member 9 can be realized in an inexpensive manner in an amplifier path 7 or 8. It may also be realized to provide very rapid and exact control.

Operation of the RF power amplifiers 5 and 6 in a phase-shifted manner, in particular, with a phase shift of 90°, has a positive influence on the stability of the RF amplifier system. The phase-sensitive power coupler (e.g., a 90° hybrid (3 dB coupler)) 13 guides the overall power coupled to its inputs 11 and 12 to the summing output 14 if the two signals at its inputs are phase-shifted by 90°. If the phase difference changes, only part of the total input power is fed to the summing output 14. The other part is supplied to the compensating output 16 and generates lost energy in the connected absorbing resistor 17. The output power supplied to the load 15 can be controlled to a desired value for the forward power by measuring the forward and reflected powers at the summing output 14 (or the values describing them) and through determining a control value from the measured values and corresponding desired values. On the other hand, additional, very fast control to a second desired value for the reflected power may be provided, because the phase-shifting member 9 can be controlled with particularly high speed.

Furthermore, a second measuring member 27, in particular, a voltage detector, is connected at the compensating output 16, which generates a signal that describes the power loss dissipated in the absorbing resistor 17 and is guided to a second control value generating member 28 that is connected to a current supply 2 of the RF power amplifier and has a desired value that describes the power loss as a further input signal. The power loss at the absorbing resistor 17 connected to the compensating connection 16 can thereby be limited.

The RF power amplifiers 5 and 6 can be designed as switching amplifiers, which can be operated with particularly little loss. Switching amplifiers are operated with particularly little loss during resonance operation, such as in, e.g., a class E amplifier. An RF signal with very little power, e.g., a logic signal, is sufficient as the input signal to the switching amplifiers 5 and 6. The output power of the switching amplifiers 5 and 6 can be controlled by its input direct current supply 2. Control of the current supply, however, often is quite slow. For this reason, rapid control through use of a controllable phase-shifting member 9 on the one hand, and second slower control of the current supply 2 on the other hand is useful.

If the first control value generating member 19 includes at least two control members 21 and 23, and a priority circuit 24 is connected thereto and includes the first control value as output signal, the phase-shifting member 9 can be controlled by only one control value. It is, however, possible to precisely influence the forward power, $V_{pi}$, and also the reflected power, $V_{pr}$.

Amplification can be particularly improved by providing more than two amplifier paths, wherein some amplifier paths have constant phase-shifting members. For example, several amplifiers or amplifier paths may be combined with several 90° power couplers, and it is possible to combine four amplifiers via three power couplers, wherein two amplifiers each are switched to one power coupler, and the signals at the summing connections of these two power couplers are connected to the third power coupler. In a similar manner, eight amplifiers can be combined with seven couplers, or sixteen amplifiers can be combined with fifteen couplers. Further combinations are feasible. Very high output powers can be thereby obtained. Moreover, the sensitivity of the amplifiers to mismatching improves with each power coupler stage, i.e., the effect on the amplifiers due to mismatching is reduced.

A number of implementations have been described. Nevertheless, it will be understood that various modifications may be made. Accordingly, other implementations are within the scope of the following claims.

What is claimed is:

1. A method of controlling an output power supplied to a load from a radio frequency amplifier system, the method comprising:
    allocating a total output power from the amplifier system between a first portion supplied to the load and a second portion supplied to a dissipative element;
    determining a value representing a forward power supplied from the amplifier system to the load or determining a value representing a reflected power reflected from the load;
    determining a first control value based a predetermined forward power value and the value representing the forward power or based on a predetermined reflected power value and the value representing the reflected power;
    determining a value representing a power supplied to the dissipative element;
    determining a second control value based on a predetermined dissipated power value and the value representing the power supplied to the dissipative element;
    controlling an amplifying member of the amplifier system that supplies power to the load based on one of the control values; and
    controlling a current supply that supplies an output current to the amplifying member based on one of the control values.

2. The method of claim 1, wherein all the total output power is allocated to the first portion and none of the total output power is allocated to the second portion.

3. The method of claim 1, further comprising:
    determining a value representing the forward power supplied from the amplifier system to the load;
    determining a value representing a reflected power reflected from the load; and
    determining a first control value based the predetermined reflected power value, the predetermined forward power value, the value representing the forward power, and the reflected power.

4. The method of claim 1, wherein the output power of the RF amplifier system supplied to the load is controlled at a rate that is faster than a rate at which the output current of the current supply is controlled.

5. The method according to claim 1, wherein the first control value controls the amplifying member, and wherein the second control value controls the current supply.

6. The method of claim 1, further comprising:
    generating the total output power by amplifying RF signals to RF power signals in at least two amplifier paths;
    adjusting a phase difference between the RF power signals in the at least two amplifier paths; and
    supplying the RF power signals to a power coupler.

7. The method of claim 6, wherein the phase difference between the RF power signals is adjusted based on the control value that controls the amplifying member.

8. The method of claim 1, further comprising:
    determining a value representing the forward power supplied from the amplifier system to the load;
    determining a value representing a reflected power reflected from the load; and
    if the value representing the reflected power is smaller or equal to the predetermined forward power value, determining the first control value based the predetermined forward power value and the value representing the forward power, and otherwise determining the first control value based the predetermined reflected power value and the value representing the reflected power; and
    controlling the amplifier member of the amplifier system that supplies power to the load based on the first control value.

9. A system for controlling a power supplied to a load from a radio frequency amplifier system, the system comprising:
    a radio frequency signal generator adapted for generating a radio frequency signal;
    an amplifier to which the radio frequency signal is supplied and that amplifies the radio frequency signal into a radio frequency power signal;
    a power coupler connected to the amplifying member for coupling the radio frequency power signals, wherein the power coupler comprises a summing connection adapted for connection to the load and a compensating connection adapted for connection to a dissipative element;
    a first control value generating member adapted for receiving a signal proportional to a power output from the power coupler at the summing connection and adapted for generating a first control signal for controlling the amplifier or a current supply that supplies current to the amplifier; and
    a second control value generating member adapted for receiving a signal proportional to a power output from the power coupler at the compensating connection and adapted for generating a second control signal for controlling the amplifier or the current supply.

10. The system of claim 9, wherein the amplifier amplifies radio frequency signal in at least two amplifier paths, wherein each amplifier path comprises at least one radio frequency power amplifier and wherein at least one amplifier path comprises a controllable phase shifter adapted for shifting a relative phase between radio frequency power signals in the at least two paths.

11. The system of claim 10, wherein the radio frequency power amplifiers are switching amplifiers.

12. The system of claim 10, wherein the amplifier comprises at least three amplifier paths, wherein each amplifier path comprises at least one radio frequency power amplifier and wherein at least two amplifier paths comprise a controllable phase-shifter adapted for shifting a relative phase between radio frequency power signals in different paths.

13. The system of claim 9, wherein the power coupler is a 90° power coupler.

14. The system of claim 13, wherein the power coupler is a 3 dB coupler.

15. The system of claim 9, further comprising a directional coupler connected to the summing connection and adapted for providing the signal proportional to a power output at the summing connection to the first control value generating member.

16. The system of claim 9, further comprising a voltage detector connected to the compensating connection and adapted for providing a signal proportional to a power output from the power coupler at the compensating connection to the second control value generating member.

17. A system for controlling a power supplied to a load from a radio frequency amplifier system, the system comprising:
- a radio frequency signal generator adapted for generating a radio frequency signal;
- an amplifier to which the radio frequency signal is supplied and that amplifies the radio frequency signal into radio frequency power signals in at least two amplifier paths, wherein each amplifier path comprises at least one radio frequency power amplifier and wherein at least one amplifier path comprises a controllable phase-shifter adapted for shifting a relative phase between radio frequency power signals at outputs of the at least two paths;
- a phase-sensitive power coupler connected to the at least two paths of the amplifier, wherein the power coupler comprises a summing output;
- a first measuring member connected to the summing output, wherein the first measuring member is adapted for providing signals characterizing a forward power supplied to the load and a reflected power reflected from the load;
- a first control value generating member adapted for receiving the signals from the first measuring member and adapted for controlling the phase-shifter based on a comparison of the signals to predetermined values for the forward power and the reflected power;
- a current supply adapted for providing current to the radio frequency power amplifiers;
- a voltage detector connected to the compensating output and adapted to provide a signal characterizing a power output from the power coupler and dissipated in a dissipative element; and
- a second control value generating member adapted for receiving the signal provided by the voltage detector and for controlling the current supply based on a comparison of the signal provided by the voltage detector with a predetermined value for the power dissipated in a dissipative element.

18. The system of claim 17, wherein the radio power amplifiers are designed as switching amplifiers.

19. The system of claim 17, wherein the first control value generating member comprises at least two control members for generating control signals and a priority circuit connected to the control members and adapted for generating the first control value based on the control values generated by the control members.

20. The system of claim 17, wherein the amplifier comprises at least three amplifier paths, wherein each amplifier path comprises at least one radio frequency power amplifier and wherein at least two amplifier paths comprise a phase-shifter adapted for shifting a relative phase between radio frequency power signals in two different paths.

21. A system for controlling a power supplied to a load from a radio frequency amplifier system, the system comprising:
- a radio frequency signal generator adapted for generating a radio frequency signal;
- an amplifier to which the radio frequency signal is supplied and that amplifies the radio frequency signal into radio frequency power signals in at least two amplifier paths, wherein each amplifier path comprises at least one radio frequency power amplifier and wherein at least one amplifier path comprises a controllable phase-shifter adapted for shifting a relative phase between radio frequency power signals at outputs of the at least two paths;
- a phase-sensitive power coupler connected to the at least two paths of the amplifier, wherein the power coupler comprises a summing output;
- a first measuring member connected to the summing output, wherein the first measuring member is adapted for providing signals characterizing a forward power supplied to the load and a reflected power reflected from the load; and
- a first control value generating member adapted for receiving the signals from the first measuring member and adapted for controlling the phase-shifter based on a comparison of the signals to predetermined values for the forward power and the reflected power,
wherein the first control value generating member comprises at least two control members for generating control signals and a priority circuit connected to the control members and adapted for generating the first control value based on the control values generated by the control members.

22. The system of claim 21, wherein the radio power amplifiers are designed as switching amplifiers.

23. The system of claim 21, wherein the amplifier comprises at least three amplifier paths, wherein each amplifier path comprises at least one radio frequency power amplifier and wherein at least two amplifier paths comprise a phase-shifter adapted for shifting a relative phase between radio frequency power signals in two different paths.

* * * * *